United States Patent [19]

Lee

[11] 4,051,353
[45] Sept. 27, 1977

[54] ACCORDION SHIFT REGISTER AND ITS APPLICATION IN THE IMPLEMENTATION OF LEVEL SENSITIVE LOGIC SYSTEM

[75] Inventor: Hua-Tung Lee, Poughkeepsie, N.Y.

[73] Assignee: International Business Machines Corporation, Armonk, N.Y.

[21] Appl. No.: 701,055

[22] Filed: June 30, 1976

[51] Int. Cl.$^2$ .................................... G06F 13/00
[52] U.S. Cl. ................... 364/716; 307/221 R; 364/900
[58] Field of Search ............ 235/152, 156; 307/203, 307/207, 221 R; 340/172.5

[56] References Cited

U.S. PATENT DOCUMENTS

| 3,806,891 | 4/1974 | Eichelberger | 340/172.5 |
| 3,983,538 | 9/1976 | Jones et al. | 340/172.5 |

OTHER PUBLICATIONS

J. E. Elliott et al., "Array Logic Processing", *IBM Tech. Disclosure Bulletin*, vol. 16, No. 2, July 1973, pp. 586–587.

*Primary Examiner*—David H. Malzahn
*Attorney, Agent, or Firm*—Wesley DeBruin

[57] ABSTRACT

Disclosed is a novel device, named the Accordion Shift Register (A.S.R.) by virtue of an alternative expansion-compaction behavior of the digital data as it passes through the device.

The A.S.R. provides an economical substitute for the conventional L1/L2 type Shift register used in a large scale integrated (LSI) logic structures known as the Level Sensitive Scan Design (LSSD). (See U.S. Pat. No. 3,783,254).

17 Claims, 23 Drawing Figures

BASIC CONCEPT IN THE USE OF ACCORDION SHIFT REGISTERS (A.S.R.) IN AN LSI UNIT

BASIC CONCEPT IN THE USE OF ACCORDION SHIFT REGISTERS (A.S.R.) IN AN LSI UNIT

SHIFT-IN OPERATION

| t = | DATA IN | CLOCKS ACTIVE ||||| DATA IN LATCHES |||||
|---|---|---|---|---|---|---|---|---|---|---|---|
| | | CA | CB | CC | CD | CE | LL0 | LL1 | LL2 | LL3 | LL4 |
| $t_0$ | — | | | | | | $X_0$ | $X_1$ | $X_2$ | $X_3$ | $X_4$ |
| $t_1$ | $D_4$ | ✓ | | | | | $D_4$ | $X_1$ | $X_2$ | $X_3$ | $X_4$ |
| $t_2$ | — | | ✓ | | | | $D_4$ | $D_4$ | $X_2$ | $X_3$ | $X_4$ |
| $t_3$ | $D_3$ | ✓ | | ✓ | | | $D_3$ | $D_4$ | $D_4$ | $X_3$ | $X_4$ |
| $t_4$ | — | | ✓ | | ✓ | | $D_3$ | $D_3$ | $D_4$ | $D_4$ | $X_4$ |
| $t_5$ | $D_2$ | ✓ | | ✓ | | ✓ | $D_2$ | $D_3$ | $D_3$ | $D_4$ | $D_4$ |
| $t_6$ | — | | ✓ | | ✓ | | $D_2$ | $D_2$ | $D_3$ | $D_3$ | $D_4$ |
| $t_7$ | $D_1$ | ✓ | | ✓ | | | $D_1$ | $D_2$ | $D_2$ | $D_3$ | $D_4$ |
| $t_8$ | — | | ✓ | | | | $D_1$ | $D_1$ | $D_2$ | $D_3$ | $D_4$ |
| $t_9$ | $D_0$ | ✓ | | | | | $D_0$ | $D_1$ | $D_2$ | $D_3$ | $D_4$ |

— INPUT DATA SEQUENCE

SHIFT-IN DATA IN PROPER PLACE

BASIC SHIFT-IN OPERATION OF AN ACCORDION SHIFT REGISTER

FIG. 3A

SHIFT-OUT OPERATION

DATA TO BE READ OUT

| t = | DATA IN | CLOCKS ACTIVE ||||| DATA IN LATCHES ||||| DATA OUT = DLL4 |
|---|---|---|---|---|---|---|---|---|---|---|---|---|
| | | CA | CB | CC | CD | CE | LL0 | LL1 | LL2 | LL3 | LL4 | |
| $t_0$ | — | | | | | | $D_0$ | $D_1$ | $D_2$ | $D_3$ | $D_4$ | $D_4$ |
| $t_1$ | — | | | | | ✓ | $D_0$ | $D_1$ | $D_2$ | $D_3$ | $D_3$ | $D_3$ |
| $t_2$ | — | | | | ✓ | | $D_0$ | $D_1$ | $D_2$ | $D_2$ | $D_3$ | $D_3$ |
| $t_3$ | — | | | ✓ | | ✓ | $D_0$ | $D_1$ | $D_1$ | $D_2$ | $D_2$ | $D_2$ |
| $t_4$ | — | | ✓ | | ✓ | | $D_0$ | $D_0$ | $D_1$ | $D_1$ | $D_2$ | $D_2$ |
| $t_5$ | — | ✓ | | ✓ | | ✓ | — | $D_0$ | $D_0$ | $D_1$ | $D_1$ | $D_1$ |
| $t_6$ | — | | ✓ | | ✓ | | — | — | $D_0$ | $D_0$ | $D_1$ | $D_1$ |
| $t_7$ | — | | | ✓ | | ✓ | — | — | — | $D_0$ | $D_0$ | $D_0$ |
| $t_8$ | — | | | | ✓ | | — | — | — | — | $D_0$ | $D_0$ |
| $t_9$ | — | | | | | ✓ | — | — | — | — | — | — |

OUTPUT READING TIMES

READING CONTROL BUILT IN TEST EQUIPMENT

OUTPUT DATA SEQUENCE

BASIC SHIFT-OUT OPERATION OF AN ACCORDION SHIFT REGISTER

FIG. 3B

| t = | DATA IN | CLOCKS ACTIVE | | | | | DATA IN LATCHES | | | | |
|---|---|---|---|---|---|---|---|---|---|---|---|
| | | CA | CB | CC | CD | CE | LL0 | LL1 | LL2 | LL3 | LL4 |
| t0 | — | | | | | | X0 | X1 | X2 | X3 | X4 |
| t1 | D4 | ✓ | | ✗ | | ✗ | D4 | X1 | X1 | X3 | X3 |
| t2 | — | | ✓ | | ✗ | | D4 | D4 | X1 | X1 | X3 |
| t3 | D3 | ✓ | | ✓ | | ✗ | D3 | D4 | D4 | X1 | X1 |
| t4 | — | | ✓ | | ✓ | | D3 | D3 | D4 | D4 | X1 |
| t5 | D2 | ✓ | | ✓ | | ✓ | D2 | D3 | D3 | D4 | D4 |
| t6 | — | | ✓ | | ✓ | | D2 | D2 | D3 | D3 | D4 |
| t7 | D1 | ✓ | | ✓ | | | D1 | D2 | D2 | D3 | D4 |
| t8 | — | | ✓ | | | | D1 | D1 | D2 | D3 | D4 |
| t9 | D0 | ✓ | | | | | D0 | D1 | D2 | D3 | D4 |

SHIFT-IN OPERATION · SHIFT-IN COMPLETE

**AN ALTERNATIVE CLOCKING SCHEME
FOR AN ACCORDION SHIFT REGISTER
– SHIFT-IN OPERATION**

FIG. 4A

| t = | DATA IN | CLOCKS ACTIVE | | | | | DATA IN LATCHES | | | | | DATA OUT = DLL4 |
|---|---|---|---|---|---|---|---|---|---|---|---|---|
| | | CA | CB | CC | CD | CE | LL0 | LL1 | LL2 | LL3 | LL4 | |
| t0 | — | | | | | | D0 | D1 | D2 | D2 | D4 | D4 |
| t1 | — | | | | | ✓ | D0 | D1 | D2 | D3 | D3 | D3 |
| t2 | — | | | | ✓ | | D0 | D1 | D2 | D2 | D3 | D3 |
| t3 | — | | | ✓ | | ✓ | D0 | D1 | D1 | D2 | D2 | D2 |
| t4 | — | | ✓ | | ✓ | | D0 | D0 | D1 | D1 | D2 | D2 |
| t5 | −1 | ✓ | | ✓ | | ✓ | −1 | D0 | D0 | D1 | D1 | D1 |
| t6 | — | | ✓ | | ✓ | | −1 | −1 | D0 | D0 | D1 | D1 |
| t7 | −2 | ✗ | | ✓ | | ✓ | −2 | −1 | −1 | D0 | D0 | D0 |
| t8 | — | | ✗ | | ✓ | | −2 | −2 | −1 | −1 | D0 | D0 |
| t9 | −3 | ✗ | | ✗ | | ✓ | −3 | −2 | −2 | −1 | −1 | −1 |

SHIFT-OUT OPERATION · OUTPUT READING TIMES

**AN ALTERNATIVE CLOCKING SCHEME
FOR AN ACCORDION SHIFT REGISTER
– SHIFT-OUT OPERATION**

FIG. 4B

SHIFTING CLOCK IMPLEMENTATION FOR AN ACCORDION S.R. (ODD LENGTH)

GATED SCANNABLE REGISTER LATCH USABLE IN AN ACCORDION SHIFT
REGISTER

ALTERNATE SHIFTING CLOCK IMPLEMENTATION FOR AN ACCORDION S.R.(EVEN/ODD LENGTH)

FUNCTIONAL DATA PATHS OF A REALISTIC LSI DESIGN
(SHOWING IRREGULARITY IN THE DISTRIBUTION OF PIL's, POL's AND INTERNAL LATCHES)

FIG 7

| LOGIC LEVEL | LATCH GROUP | BIT # | DESIGN (a) TRANSVERSE A.S.R. CHANNEL # | | | | | | DESIGN (b) LONGITUDINAL A.S.R. CHANNEL # | | | | | |
|---|---|---|---|---|---|---|---|---|---|---|---|---|---|---|
| | | | 1 | 2 | 3 | 4 | 5 | 6 | 1 | 2 | 3 | 4 | 5 | 6 |
| 0 | PIL1 | ① | ⓪ | | | | | | ⓪ | | | | | |
|   |      | ② | | ⓪ | | | | | | ⓪ | | | | |
|   |      | ③ | | | ⓪ | | | | | | ⓪ | | | |
|   |      | ④ | | | | ⓪ | | | | | | ⓪ | | |
| I | LL1 | 1 | 1 | | | | | | 1 | | | | | |
|   |     | 2 | | 1 | | | | | 2 | | | | | |
|   |     | 3 | | | 1 | | | | 3 | | | | | |
|   |     | 4 | | | | 1 | | | | 1 | | | | |
|   |     | 5 | | | | | 1 | | | 2 | | | | |
|   | POL1 | ① | ④ | | | | | | ④ | | | | | |
|   | PIL2 | ① | | | | | ⓪ | | | | | | ⓪ | |
| II | LL2 | 1 | | | | | | 1 | | | 1 | | | |
|   |      | 2 | 2 | | | | | | | 2 | | | | |
|   |      | 3 | | | 2 | | | | | 3 | | | | |
|   | PIL3 | ① | | | | | ⓪ | | | | | | | ⓪ |
|   |      | 2 | | | 2 | | | | | | | | | 1 |
|   |      | 3 | | | | 2 | | | | | | | | 2 |
| III | LL3 | 1 | | | | | 2 | | | | 3 | | | |
|   |     | 2 | | | | | | 2 | | | | 1 | | |
|   |     | 3 | 3 | | | | | | | | | 2 | | |
|   |     | 4 | | | 3 | | | | | | | 3 | | |
|   | POL3 | ① | ④ | | | | | | ④ | | | | | |
| IV | LL4 | 1 | | | 3 | | | | | | | | 1 | |
|   |      | 2 | | | | 3 | | | | | | | 2 | |
|   |      | 3 | | | | | 3 | | | | | | 3 | |
|   | DUM* | 1 | | | | | | 3 | | | | | | 3 |
|   | POL4 | ① | | ④ | | | | | | ④ | | | | |
|   |      | ② | | | ④ | | | | | | ④ | | | |
|   |      | ③ | | | | ④ | | | | | | ④ | | |
|   |      | ④ | | | | | ④ | | | | | | ④ | |

LATCH ASSIGNMENT TABLES IN AUXILIARY A.S.R. DESIGN (TWO DIFFERENT DESIGNS)

| DESIGN(a), TRANSVERSE A.S.R. | A.S.R. STAGE # | | | | |
|---|---|---|---|---|---|
| | ⓪ | 1 | 2 | 3 | ④ |
| 1 | PIL1-1 | LL1-1 | LL2-2 | LL3-3 | POL1-1 |
| 2 | | -2 | -2 | ↓ -3 | ↓ -4 | POL3-1 |
| 3 | | -3 | -3 | PIL3-2 | LL4-1 | POL4-1 |
| 4 | ↓ -4 | -4 | ↓ -3 | -2 | -2 |
| 5 | PIL2-1 | ↓ -5 | LL3-1 | ↓ -3 | -3 |
| 6 | PIL3-1 | LL2-1 | ↓ -2 | DUM-1 | ↓ -4 |

(Row headers: A.S.R. CHANNEL#)

↑ INPUT STAGE     OUTPUT STAGE ↑

ILLUSTRATION OF A HIGH LEVEL A.S.R. 16 x 18 COMPOSITION

USE OF PSEUDO - PIL's
AND USE OF I - PAD SHARING IN TIME DIVISION SYSTEM

USE OF PSEUDO - POL's
AND USE OF O - PAD SHARING IN TIME DIVISION SYSTEM

COMPOSITION OF CLOCK & GATING SIGNALS FOR
COMBINED SHIFT-OUT-SHIFT-IN OPERATION OF ASR

ACCORDION SHIFT REGISTER AND ITS APPLICATION IN THE IMPLEMENTATION OF LEVEL SENSITIVE LOGIC SYSTEM

BACKGROUND OF THE INVENTION

A description of the background points out the desirability and advantages of LSSD logic system design disciplines. The hardware backbone, an auxiliary shift register built onto and around the system latches, that supports the LSSD is then brought into focus. Its principle of operations and its implementation in the current practice form are then given in order to compare them with those involved in the A.S.R.

This is followed by a detailed description of the invention. Of no less importance are the several supplementary teachings concerning the use of the A.S.R. in the LSSD environment. A main point here is that for all of its substantial hardware economy, the use of A.S.R. is completely free of added burden from what is already required of the conventional shift register design.

Application of the new device is finally brought to full focus by introduction of the combined shift-out shift-in operation to the A.S.R. auxiliary system. This produces further operational simplicity and efficiency.

The above ABSTRACT is not to be taken either as a complete exposition or as a limitation of the present invention, the full nature and extent of the invention being discernible only by reference to and from the entire disclosure

FIELD OF THE INVENTION

This invention relates to logic systems, which may include arrays, for use in digital computers or the like and more particularly, to an organization of logic (and arrays) in such systems to render them modular, generalized and level-sensitive. Further, this invention relates to logic systems which may include arrays and more particularly, to the organization thereof whereby the testing and examination of test data are facilitated.

In addition, the general applicability of this invention to wherever a conventional shift register is used solely for data bits movement purpose should be well understood. Present discussion for its use in the relatively complicated LSSD environment is considered to have given enough explanation to warrant further elaboration on simpler cases.

CROSS-REFERENCE TO RELATED APPLICATIONS AND PATENTS

U.S. patent application Ser. No. 701,052, entitled "Level Sensitive Embedded Array Logic System" filed June 30, 1976 by Messrs. E. B. Eichelberger, E. I. Muehldorf, R. G. Walther and T. W. Williams, and of common assignee.

U.S. patent application Ser. No. 701,041, entitled "Method of Propagation Delay Testing A Functional Logic System with Embedded Array" filed June 30, 1976 by Messrs. E. B. Eichelberger, E. I. Muehldorf, R. G Walther and T. W. Williams, and of common assignee.

U.S. patent application Ser. No. 701,054, entitled "Method of Level Sensitive Testing a Functional Logic System with Embedded Array", filed June 30, 1976 by Messrs. E. B. Eichelberger, E. I. Muehldorf, R. G. Walther and T. W. Williams, and of common assignee.

U.S. patent application Ser. No. 701,053, entitled "Reduced Overhead for Gated B Clock Testing" filed June 30, 1976 by Messrs. E. B. Eichelberger and T. W. Williams and of common assignee.

U.S. patent application Ser. No. 589,231, entitled, "High Density Semiconductor Chip Organization" by E. B. Eichelberger and G. J. Robbins, filed June 23, 1975, granted as U.S. Pat. No. 4,006,492 on Feb. 1, 1977, and of common assignee.

U.S. patent application Ser. No. 701,376, entitled "Clock Generation Network for Level Sensitive Logic System" by E. B. Eichelberger and S. DasGupta, filed June 30, 1976 and of common assignee. U.S. patent application Ser. No. 534,606, filed Dec. 20, 1974 entitled "Testing Embedded Arrays" by E. B. Eichelberger, granted as U.S. Pat. No. 3,961,252 on June 1, 1976 and of common assignee.

U.S. patent application Ser. No. 534,608, entitled "Testing Embedded Arrays" by J. R. Cavalieri and R. Robortaccio, filed Dec. 20, 1974, granted as U.S. Pat. No. 3,961,254 on June 1, 1976 and of common assignee.

U.S. patent application Ser. No. 534,605, entitled "Testing Embedded Arrays" filed Dec. 20, 1974 by W. P. Hurley and H. P. Muhlfeld, granted as U.S. Pat. No. 3,961,251 on June 1, 1976 and of common assignee.

U.S. Pat. No. 3,783,254, entitled "Level Sensitive Logic System", application Ser, No. 297,543, filed Oct. 16, 1972 grantd Jan. 1, 1974 to E. B. Eichelberger and of common assignee.

U.S. Pat. No. 3,761,695, entitled "Method of Level Sensitive Testing A Functional Logic System", application Ser. No. 298,087, filed Oct. 16, 1972, granted Sept. 25, 1973 to E. B. Eichelberger and of common assignee.

U.S. Pat. No. 3,784,907, entitled "Method of Propagation Delay Testing A Functional Logic System", application Ser. No. 298,071, filed Oct. 16, 1972, granted Jan. 8, 1974 to E. B, Eichelberger and of common assignee.

BACKGROUND OF THE INVENTION AND PRIOR ART

In the past, large and complex logic circuits were built up of relatively simple smaller units. Manufacturing and diagnostic testings of such smaller units as well as of the larger ones were routinely done without much complicity. This was possible because of the prevailing accessibility to the body of the circuitry both for the application of test stimuli and for the probing and examination of circuit responses. Occasionally, some normally interior points were specially brought to convenient locations explicitly for testing purpose. Such design diversions rarely amounted to any substantial problem.

With the advent of large scale integration (LSI), however, direct accessibility to the body of a group of circuits in any physical unit (e.g., a chip, a module, etc.) becomes greatly limited. This comes about both because of the vastly increased number of circuits included within an LSI unit and because of the microscopic dimensions these circuits now assume. How to test these units has grown to be a major concern.

The problem of testing an LSI unit is further aggravated by the presence of the now inaccessible storage elements (or system latches) which are regularly imbedded among the combinatorial logic networks. Without an assured way of setting and examining the logic states of such imbedded latches, there can be no testing of the associated logic networks. Yet, a reliable and thorough testing of all LSI units is indispensable in manufacturing as well as in maintenance.

Several recent inventions listed under "Cross-Reference to Related Applications and Patents", provide system design methods and discipline that answer the above need. They all come under the generic title LSSD (Level Sensitive Scan Design). A common main thrust of these inventions is to prescribe a built-in capability for every LSI unit (a chip, a module, etc.) whereby the entire logic state(s) of the unit, when under test, can be explicity as set and/or examined through exercising certain input/output (I/O) procedures at a limited number of I/O terminals. This requirement is implementable by imparting a shift-register capability to everyone of the logic system latches in the unit and thereupon organizing these shift register latches (SRL) into one or more shift register data channels with their terminal stages accessible to the outside world.

Detailed operations with the SRL facility for various aspects of the testing purpose is given in most of the aforementioned inventions. Particular reference may be made to FIG. 8 of U.S. Pat. No. 3,761,695 and FIGS. 7, 8 and 9 of U.S. Pat. No. 3,784,907.

For a summary, it suffices to relate the following:

In test operation, certain desired logic test pattern(s) are serially inputted and shifted to the appropriate latch locations when the unit is operated in the "shift mode", so to speak, (i.e., by withholding the system clock excitations and turning on the shifting clocks to the unit). When this is done, the latch states will provide the desired stimuli for the testing of the related logic nets. Now, propagate the test pattern(s) through the nets by executing one or more steps of the "function mode" operation (i.e., by exercising a few system clock excitations). The response pattern of the logic networks to the applied stimuli is now captured by the system latches, in a known manner depending on certain details in hardware design, often replacing the original inputted test pattern(s). Then the system reverts to the shift-mode operation, outputting the response pattern(s) for examination.

As is generally recognized, with the current practice of using the conventional shift registers for the SRL's, the above facility is obtained at a hardware cost which, in most cases, can be quite an economical burden. (Experience has indicated at least 10 to 15% increase in hardware, and it may go as high as 35% or more). This is due to the overhead addition of a second latch to everyone of the system latches in order to make it into a workable S.R. stage in the known art manner. (FIG. 1A shows an SRL in which L1 is the system latch and L2 is the added second latch herein mentioned. FIG. 1B shows a way of using the SRL's in an LSSD system. Similar illustrations, with more or less details also appear in FIGS. 9 and 7 of U.S. Pat. No. 3,784,254.)

This invention produces a shift register system, named Accordion Shift Registers (A.S.R.), that can accomplish the same required task without the aid of the said second latches. For the substantial savings thus made possible, a small price is to be paid in the form of N/2 shift clock gating controls per LSI unit, where N is the length of shift register channels chosen for that unit.

As part of teaching in this invention, it will also be shown how the design of an efficient A.S.R. system in any given LSSD environment is easy to achieve and shall in no way be hampered by existing conditions, such as I/O limitations, lack of primary I/O latches, etc.

Also, the combined shift-out shift-in operation for the A.S.R. is introduced to fully disclose the invention.

SUMMARY OF THE INVENTION

Conventional shift registers (S.R.) use two latches (customarily designated as L1, L2 or LA, LB) for every S.R. stage. Shift-in and shift-out operations are accomplished by parallel application of a two-phase clock sequence (usually referred to as A-clock and B-clock) to the L1's and L2's respectively.

The accordion shift register (A.S.R.) is an economical substitute for the conventional S.R. It performs the same function as the S.R., namely, moving binary data bits into and out of the functional latch positions but does it with one half as many latches by eliminating the need of an associated L2 from every S.R. stage.

Similar to the conventional S.R.'s, latches (now one latch for every A.S.R. stage) are organized and wired into one or more data channels. The A- and B-clocks are likewise applied to alternate latches within each channel in much the same way as in the conventional case. Unlike those in the conventional design, however, these shift clock signals are to be controlled here by a set of shift clock gating signals so that the various latch stages will become active, singularly or severally, at any one clock time (A or B) according to specific schedules for the shift-in and the shift-out operations.

As will become clear later, the said scheduling of the A- and B-clocks has the effect of causing the data in the A.S.R., as it is being shifted down the channel(s), to experience an alternative expansion and compaction in its occupancy of the latch positions during successive shift-out and shift-in cycles. Perhaps such a characteristic behavior of the data substance in moving through the A.S.R. would find a more accurate analogy in the body movement of certain crawling worms or snakes than in that of an accordion, which lacks the important element of a forward motion. Nevertheless, the name Accordion S.R. is chosen for my new device, for obvious reasons.

Now, the above device is especially attractive for use in the LSSD environment of the so-called LSI Structured Design system.

In this LSI design system, a set of functional system latches is required to be formed into one or more auxiliary S.R. circuit(s) so that data signals may be shifted into or out of them for test/diagnostics purposes as briefly explained in "Background of the Invention and Prior Art."

Also explained there is the well known fact that in implementing the auxiliary S.R. circuit(s) in the conventional way, there is to be paid an extra cost in hardware; for, to every participating system latch the designer must put in one additional latch to form a workable S.R. stage.

Using the A.S.R. design, however, one will make the original system latches, with shift clock gating circuits added, to serve without the aid of additional latches. The said gating circuits, including the augmentation of an imbedded 2-way AND circuit to a 3-way AND circuit in each latch, are much simpler and less costly additions in the known art than the addition of whole latches. A typical A.S.R. used in the LSSD environment is shown in the auxiliary shift mode circuit part of FIG. 5A. Also shown there is the "function-mode" part of the latch circuits, which is exactly the same as that in the conventional S.R. design and hence does not warrant further discussion in this application.

For efficient application of the A.S.R. technique in the LSI Structured Design environment, the following three supplementary recommendations will form an integral part of the basic teachings of this invention.

1. Organize the latches, in some convenient order, into as many parallel A.S.R. channels as the number of natural primary input and primary output latches (PIL's and POL's) may allow. Make parallel A.S.R.'s of uniform length within an LSI unit, and design an even number of stages into each A.S.R. channel so as to facilitate concatenation of A.S.R.'s at higher level packages. Add dummy latches to make up for stage shortages in some channels when necessary.

2. Use pseudo-PIL's and pseudo-POL's to broaden the A.S.R. channel width when desired, i.e., use some internal system latches for the scan signal I/O latches in the shift-mode cicuitry so that more A.S.R. channels may be created at will.

3. When necessary, share the use of the signal I/O pads (or pins) pertaining to the function-mode circuitry with the shift-mode scan data and clock gating signal lines.

FIGS. 10A and 10B give schematic diagrams in which the design approaches of (2) and (3) are included. These two types of design approaches are possible because the function-mode and the shift-mode operations are completely isolated from each other in the time domain.

Finally, FIGS. 6, 7, 8 and 9 illustrate the several points involved in the above recommendation (1). It should be noted that the "transverse" and the "longitudinal" A.S.R. organizations, illustrated as the designs (a) and (b) respectively, are but superficially nominal designations for the illustrated cases. A real design A.S.R. organization does not have to carry with it any system logic significance. It may very well be oriented towards geometric (or physical) wiring convenience, for example.

When A.S.R.'s are used for the LSSD implementation purpose, one can further take advantage of the fact that a succeeding shift-in operation may be made partially simultaneous with the preceding shift-out operation by using a combined A-/B-clock schedule. With this combined shift-out shift-in scheme, the system not only is capable of faster operation but also requires a set of simpler gating signals as shown in FIG. 11.

Referring to U.S. Pat. No. 3,783,254, the shift register illustrated and disclosed in the Level Sensitive Logic System employs two direct current latches for each shift register stage. Shift-in and shift-out operations are accomplished by parallel application of a two-phase clock system (referred to as A-clock and B-clock) to the first (L1) and second (L2) latches, respectively of each stage of the shift register. (Reference is made to FIGS. 7, 8 and 9 of U.S. Pat. No. 3,783,254).

The accordion shift register (A.S.R.), in accordance with the invention is economical and efficient in operation. Only a single direct current latch is required per shift regiser stage of the accordion shift register. The accordion shift register (A.S.R.) in accordance with the invention has particular utility when employed in a Level Sensitive Logic System generally of the type disclosed and claimed in U.S. Pat. No. 3,783,254, or in a Level Sensitive Embedded Array Logic System generally of the type disclosed in U.S. patent application Ser. No. 701,052, filed concurrently herewith entitled "Level Sensitive Embedded Array Logic System".

The specification of U.S. Pat. No. 3,783,254, and the specification of U.S. patent application Ser. No. 701,052 are incorporated herein by reference to the full and same extent as though they were respectively set forth word for word herein.

It is a primary object of this invention to provide a novel shift register device, named Accordion Shift Register (ASR) after its characteristic effect on the data passing through it.

It is an object of this invention to provide an A.S.R. for an economical substitute for the conventional two-latch type (L1/L2) shift register when its second latch per stage is used solely to make the shift operation possible in the conventional manner.

It is an object of the invention to provide a Level Sensitive Logic System, which efficiently and economically employs Accordion Shift Register means.

It is an object of the invention to provide a Level Sensitive Embedded Array Logic System which efficiently and economically employs Accordion Shift Register means.

It is an object of the invention to provide a Level Sensitive Logic System including Accordion Shift Register means which may be readily and effectively tested.

It is an object of this invention to provide a multi-channel A.S.R. for the implementation of the so-called Level Sensitive Scan Design in an LSI Structured Design which may be readily and effectively tested.

It is an object of the invention to provide a Level Sensitive Embedded Array Logic System including Accordion Shift Register means which may be readily and effectively tested.

It is an object of the invention to provide an improved organization and arrangement of interconnected combinatorial logic circuit means, (with or without embedded array storage means), and accordion shift register means all fabricated on a single semiconductor chip.

It is an object of the invention to provide an improved organization and arrangement of interconnected combinatorial logic network means, (with or without embedded array storage means) and accordion shift register means all contained in an electronic package, where said organization and arrangement facilitates the dynamic measurement of the merit of said combinatorial network means, embedded array storage means, and accordion shift register means, respectively, buried within said electronic package.

It is an object of the invention to provide circuitry including combinatorial logic circuit means (with or without embedded array storage means) and accordion shift register means all arranged and interconnected to facilitate testing irrespective of the level of the package, such as chip, module, card, board, and system level.

It is an additional object of the invention to teach effective ways of organizing and designing the auxiliary multi-channel shift registers used in the LSSD environment so as to be free from existing hardware constraints such as the primary I/O latch limitations and the I/O pad (or pin) limitations.

It is another additional object of this invention to provide an A.S.R. system using the combined shift-out shift-in operation so as to simplify the gating control signals and to increase the operational speed.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 3A gives a table showing details in a basic shift-in operation of an A.S.R.

FIG. 3B gives a table showing details in a basic shift-out operation of an A.S.R.

FIG. 4A gives a table showing details of an alternative Shift-in clocking scheme for an A.S.R.

FIG. 4B gives a table showing details of an alternative shift-out clocking scheme for an A.S.R.

FIG. 7 gives two tables illustrating latch assignments in two different designs of A.S.R. for the arbitrary LSI unit of FIG. 6.

DESCRIPTION OF THE PREFERRED EMBODIMENT

Introduction

Figure 1A:
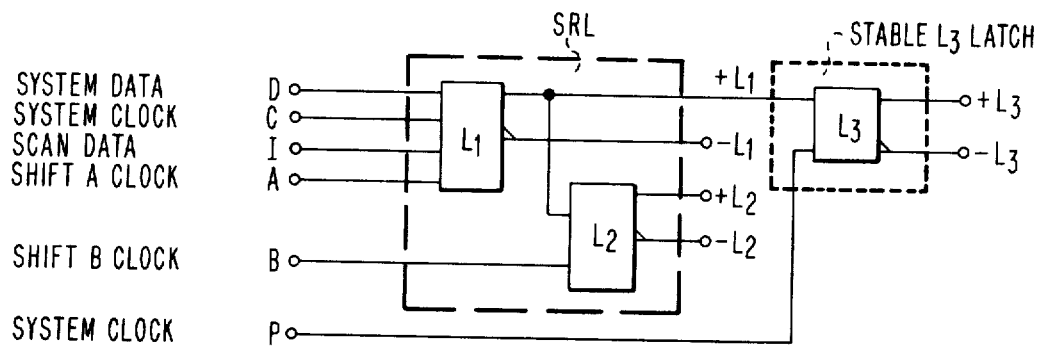
FIG. 1A depicts, in schematic block diagram form, a shift register latch (SRL) of the conventional design, using two latches per SRL stage. Here L1 is rendered suitable for use in an LSSD logic system. Also included in FIG. 1A is a stable latch which, when included, will make a Stable Shift Register Latch (SSRL) in accordance with the prior art.

Whereas the Accordion Shift Register (A.S.R.) is a novel apparatus in its own right as well as an economical alternative to the well known conventional L1/L2 type Shift Register (S.R.) in many of its general applications (where simultaneous shifting of bits is not essential)* it is nonetheless originally conceived for use in the LSSD environment of an LSI product.

[*Examples: Bit serializers in digital communication channels; serial to parallel bit assembler in error-checking-correction apparatus in a digital transmission equipment].

Furthermore, probably nowhere else can the economy be nearly as significant an issue as in the LSSD case because of the large scale involvement. Hence, it is appropriate to introduce the A.S.R. via a brief introduction of its major application field and the place it can hold in that field.

Testability is one of the major problems encountered by the art in progress towards LSI (Large Scale Intergration). As the circuit densities of chips and Field Replaceable Units (FRU) have been increased, the capability of automatic test generation has not been able to keep pace. One of the major benefits of Level Sensitive Scan Design Structures (LSSD), generally of the type disclosed and claimed in U.S. Pat. No. 3,783,254, is that they reduce the testing problem to solvable proportions.

For LSSD structures, the DC test problem is simplified to one of generating tests for combinatorial circuits. This can be effectively solved using existing techniques and results in computer run times that increase almost no greater than linearly with circuit count. LSSD also provides the necessary structure and control to allow an effective delay test. (See U.S. Pat. Nos. 3,761,695 and 3,784,907).

The structured design in accordance with the invention and with the invention disclosed and claimed in U.S. Pat. No. 3,783,254 answers the test/diagnostic needs of LSI units or structures. LSI units or structures may be defined as high circuit density structure units, or functional units fabricated by Large Scale Integration Techniques. The structured design in accordance with the invention, essentially prescribes a built-in capability for every LSI unit (chip, card, module or field replaceable unit, FRU) whereby the entire logic state(s) of the unit, when under test, can be explicitly set and/or examined through exercising certain I/O procedures as disclosed and claimed in U.S. Pat. Nos. 3,761,695 and 3,784,907. This is made practicable by imparting a shift register capability to every one of the logic system latches in the unit and thereupon organizing these latches into one or more auxiliary shift register data paths or channels for the aforementioned purpose.

In accordance with the invention, as will be more fully appreciated from the detailed description of the invention hereinafter, the system hardware required to provide a "Level Sensitive Logic System" is reduced. (Namely, referring to FIGS. 1A and 1B, in accordance with the invention the need of a latch L2 in association with every one of the system latches L1, which is there irrespective of the LSSD requirement, is eliminated). In accordance with the invention, this reduction in hardware is accomplished without compromising any of the functional objectives and performance quality of the auxiliary shift register path(s).

In practicing the invention, the substantial savings in hardware is offset to a limited degree by the requirement of N/2 shift clock gating signals per LSI unit, where N is the length of the longest auxiliary shift register data path in the unit. As will be apparent from the detailed description that follows, this requirement of shift clock gating signals may be made a minimal burden by adopting a terminal-pad sharing method for inputting these gating signals.

Background Implementation of Level Sensitive Scan Design (LSSD) Structures

Reference is made to U.S. Pat. No. 3,783,254. As background to, and to facilitate a complete and full understanding of the invention and the preferred embodiment thereof, the logical circuitry of FIGS. 1A and 1B will be briefly discussed. The logical circuitry depicted in FIGS. 1A and 1B "per se" forms no part of the invention disclosed and claimed in this application.

FIG. 1A discloses the general form of a single stage of Shift Register Latch (SRL) which consists of two latches L1 and L2. In shift mode (or scan mode) operation, the scan data comes into L1 and leaves from L2. System data inputs also come into L1 of the SRL during the function mode operation. System outputs may be taken from either L1 or L2.

System data inputs can be more general than depicted by the Polarity Hold Shift Register Latch of FIG. 1A.

As is fully explained in U.S. Pat. No. 3,783,254, the system data latch may be a Set-Reset Shift Register Latch as depicted in FIG. 1C. In all cases, the system data inputs must be controlled by system clock inputs such that when the system clock is "off", the system data inputs cannot change the state of the L1 latch.

A Stable Shift Register Latch (SSRL) is composed of an SRL and a third latch L3 as shown in the dotted box of FIG. 1A. The Stable latch L3 is used to provide stable system output that will not change during scan.

Ramifications such as this one and the set-reset SRL are peripheral to the central fact that that SRL contains a second elementary latch which it is my object to eliminate.

Figure 1B:
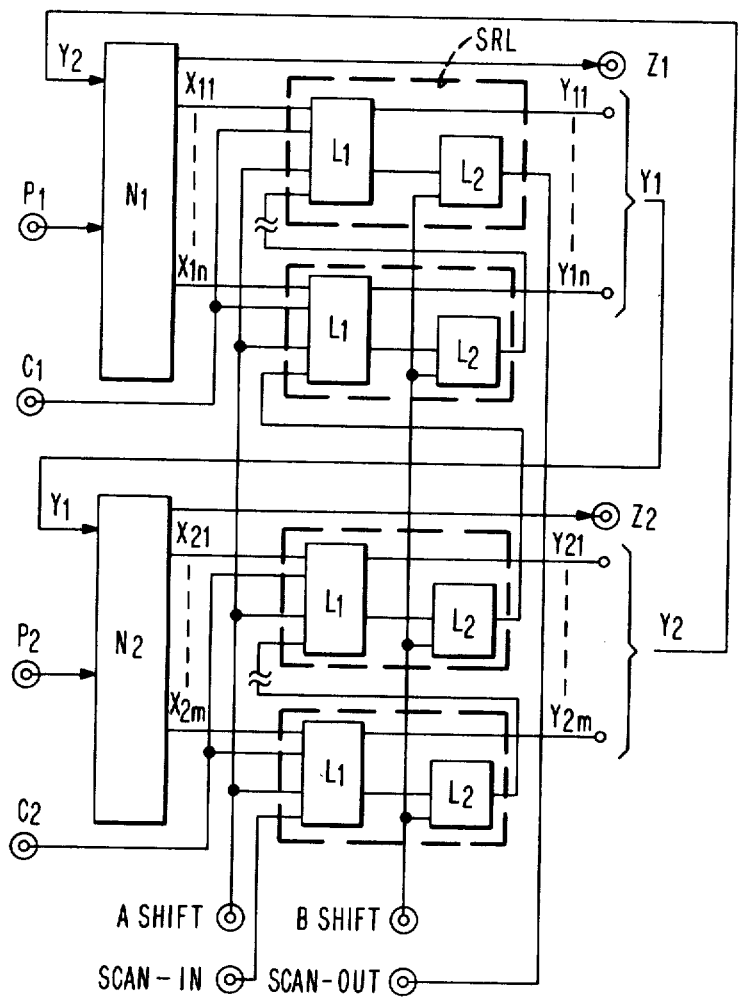
FIG. 1B depicts in schematic block diagram form, a general structure and organization for Level Sensitive Scan Design (LSSD) Sub-System, showing positions of the SRL's.
Figure 1C:
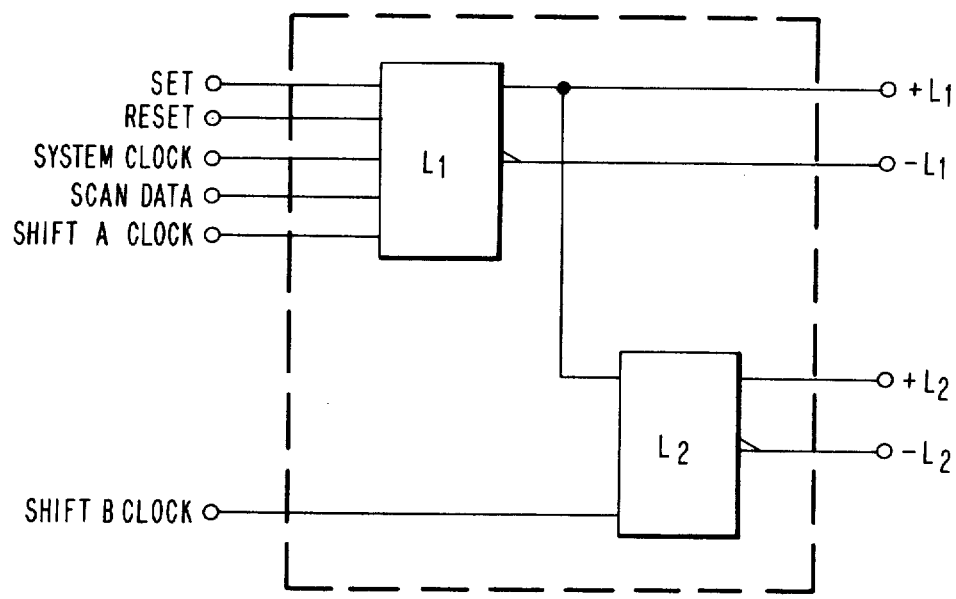
FIG. 1C depicts a Set-Reset Shift Register Latch employing dc latches L1 and L2.

Referring to FIGS. 1A, 1B and 1C the A-shift clock is used to clock the scan-in data into latch L1. The B-shift clock is used to clock the L1 data into L2. The "P" clock of FIG. 1A is used to clock the data in latch L1 into the Stable L3 latch when it is used.

Figure 1D:
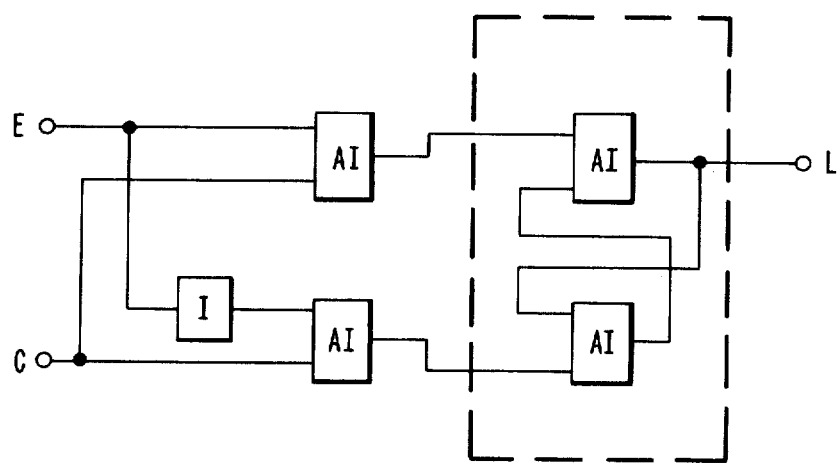
FIG. 1D depicts a block diagram of one form of a clocked dc latch implemented in AND Invert gates which may be employed in the Accordion Shift Register of the preferred embodiment of the invention.

FIG. 1D is a block diagram of one form of a clocked dc latch implemented in AND Invert gates which may be employed in an LSSD logic system of the general type depicted in FIG. 1B. The dc latch depicted in FIG. 1D corresponds identically to the dc latch shown in FIG. 3 (and described) in U.S. Pat. No. 3,783,254.

Figure 1E:
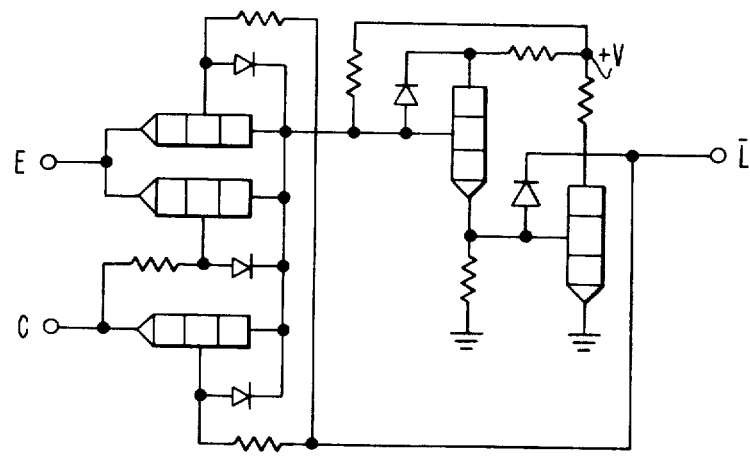
FIG. 1E is a circuit diagram of a latch performing the inverse of the same function as the one shown in FIG. 1D. The latch circuit may be employed in the preferred embodiment of the invention.

FIG. 1E is a circuit diagram of a latch performing the inverse of the same function as the one shown in FIG. 1D. The latch circuit depicted in FIG. 1E corresponds identically to the latch circuit shown in FIG. 4 (and described) in U.S. Pat. No. 3,783,254. A similar block diagram to FIG. 1D may be found for the clocked set-reset latch of FIG. 1C in FIG. 6 of U.S. Pat. No. 3,783,254.

Figure 1F:
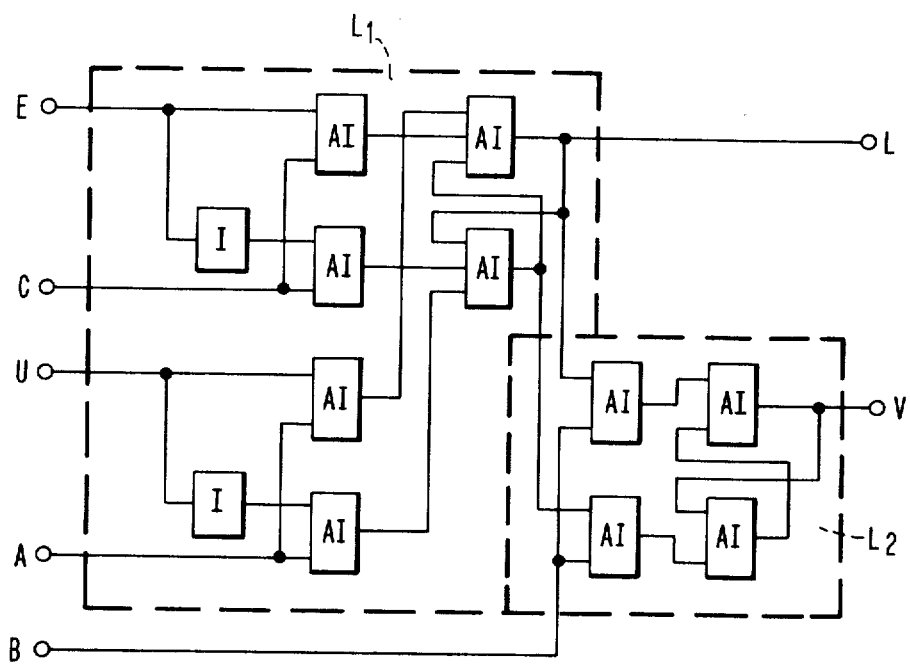
FIG. 1F is a block diagram of a clocked dc latch in accordance with the prior art (U.S. Pat. No. 3,783,254) and having provision for scan-in/scan-out.

FIG. 1F is a block diagram of a clocked shift register latch (SRL) latch configuration, having provision for scan-in/scan-out which may be employed in the generalized LSSD logic system depicted in FIG. 1B. The latch configuration of FIG. 1F corresponds identically to latch configuration shown in FIG. 9 (and described) in U.S. Pat. No. 3,783,254.

In FIG. 1B, the general structure is of a two clock design. The SRL cells are shown as latch pairs (L1 and L2) with the appropriate clocking and data inputs. The blocks denoted by N1 and N2 corresponds to arbitrary combinatorial networks. In general, the clock C1 gates signals generated in N1, and the clock C2 gates signals generated in N2, into the appropriate latches.

Reference is made to the generalized LSSD logic system of FIG. 1B which is in accordance with the invention disclosed and claimed in U.S. Pat. No. 3,783,254.

To give a clearer picture of the system circuitry involved and to facilitate an understanding of applicant's invention, reference is made to the prior art circuitry depicted in FIGS. 1A through 1F. In particular, reference is made to FIGS. 1A and 1B. As shown, an LSSD implementation calls for an L2 latch to be associated with every system latch L1. All system latches are thus rendered into SRL's (shift register latches) and may hence be connected, in one or more strings, to form the desired auxiliary shift data path(s) in the manner more fully disclosed and discussed in U.S. Pat. No. 3,783,254.

In this arrangement, the regular system clocks C1, C2, etc., gate the system (functional) data into the L1 latches of the relevant SR's. The system data from each SRL may be taken either directly from L1 (as shown) or, if one wants to, from L2. In the latter case, the B shift clock, as fully described hereinafter, will have to become a part of the system clocks as well.

In addition to the above system clocks, there is a second clock sequence, namely, the two-phased A shift and B shift clocks. They are applied only during execution of the shift mode operation. Data bits in parallel shift register channels are then shifted along between primary input (Scan-In) and output (Scan-Out) terminals in the standard fashion. Only a single channel is depicted in FIG. 1B.

For race-free operation of the logic nets (N1, N2), all system clocks (C1, C2) are non-overlapping. Likewise, the shift clocks A and B are non-overlapping also.

By making the application of the system clocks and that of the shifting clocks mutually exclusive, the function mode operation and the shift mode operation are isolated from each other, both in time and in space except for the logical coupling points at all L1's, (or L2's as the case may be).

There are several other features and LSSD Rules exhibited in the schematics of FIGS. 1A and 1B, such as: the definition of an SSRL (Stable SRL) and its associated system clock P; the exclusion of direct logic signal feedbacks among latches controlled by a system clock of the same phase (e.g., outputs Y1 are not allowed to feedback into the logic net N1), etc. These features and rules will not be extensively discussed herein since they are fully disclosed and discussed in U.S. Pat. No. 3,783,254. This invention supports all these features and rules which are, however, not part of this invention.

DESCRIPTION OF THE INVENTION

As far as meeting the Structured Design objectives of LSSD is concerned, the implementation method disclosed and claimed in U.S. Pat. No. 3,783,254, represents a direct, straight forward approach utilizing latches L1 and L2 for each shift register latch. In accordance with the invention disclosed and claimed in this application, the Structured Design objectives of LSSD are accomplished, as will be more apparent from the detailed description that follows, without the employment of structure corresponding to latches L2.

The basic concept of the preferred embodiment of the invention will first be given under simplified conditions. This will be followed by an explanation of an actual implementation scheme for the required sequences of the shift clocks.

Having established the basic design proposal, I will then present a broadened view of the design principle and show how to handle LSI units with any arbitrary internal latch distribution and/or primary I/O latches and I/O pads (pins) availability conditions.

Figure 2:
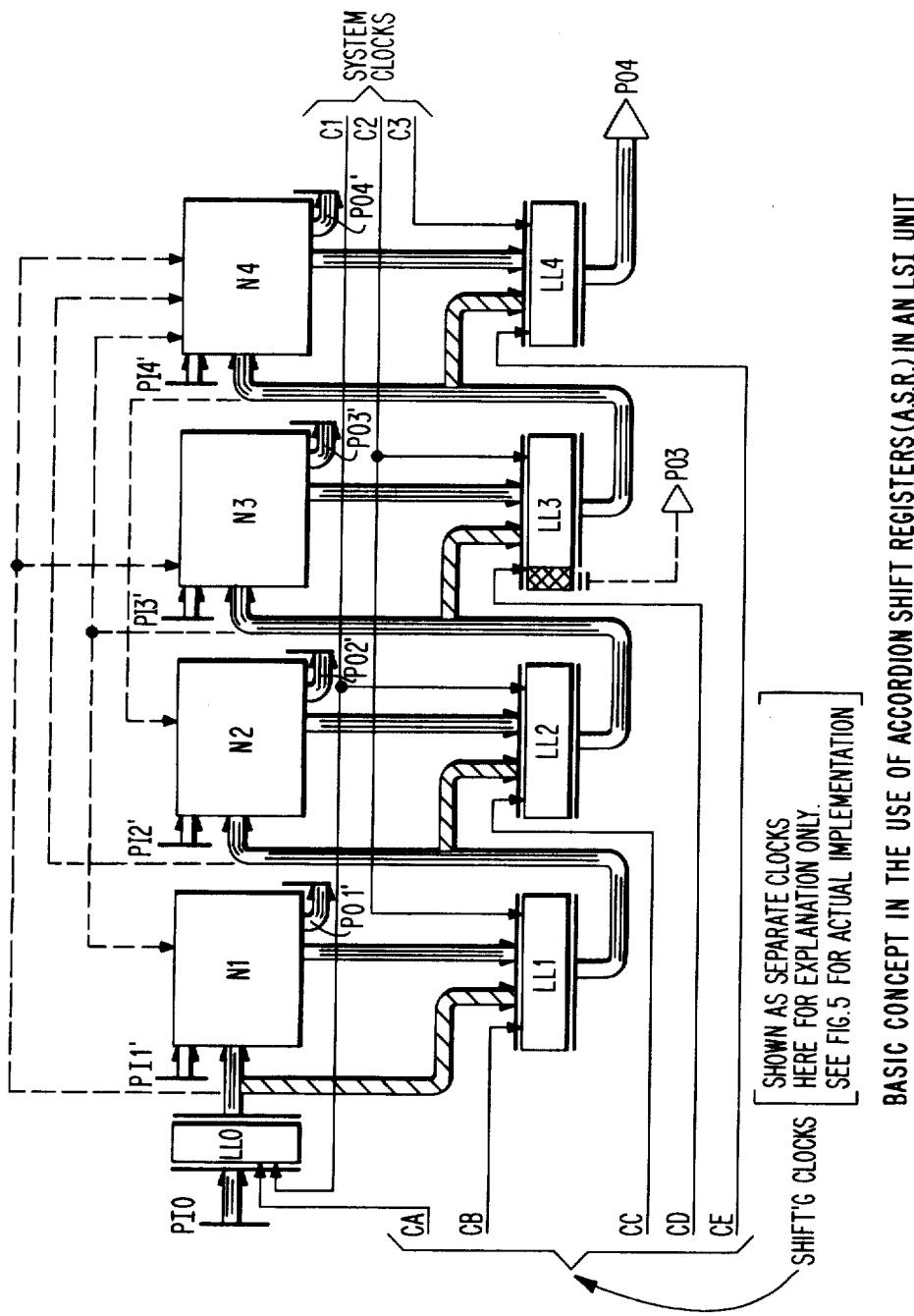
FIG. 2 depicts, in block diagram form, an LSI unit in which the system latches are shown organized into a conceptual Accordion Shift Register.

Reference is made to FIG. 2 of the drawing. The illustrated LSI unit is diagrammed in terms of a series of combinational logic networks N1, N2, etc., and their input, inner-stage coupling and output latch banks LL$\phi$, LL1, etc. Each member of a bank LLx may be a dc latch of the type L1 of FIG. 1A. See also FIGS. 1D and 1E. From the primary input terminals PI$\phi$ to the primary output terminals PO4, the functional data paths are depicted by the ruled transmission lines ( ⇒ ) between the LLx''s and the Nx's. Propagation of system data through the respective latch banks is controlled by the system clocks C1, C2, etc.

In addition, the diagram also includes direct I/O's to add from each logic net (e.g., PI1' and P01' to and from N1) as well as some feedback and cross-feed paths (shown in dashed lines among the various sectionalized circuits of the unit). These, however, are not of our immediate concern, as they are in accord with the teaching of U.S. Pat. No. 3,783,254.

All the above constitutes a known LSI design, and complies with all the relevant Structured Design (LSSD) rules as disclosed in U.S. Pat. No. 3,783,254.

Now, to fulfill the text/diagnostics needs of an LSI design I still subscribe, in recognition of the I/O economy requirement, to the teaching of employing a shift mode operation for control and examination of the states of all latches. Only, I shall not require augmenting each system latch into an SRL and thereupon establishing the shift register data path(s) in the manner disclosed and claimed in U.S. Pat. No. 3,783,254. Instead, I simply connect the system latches directly into parallel channels of what may be called the "accordion shift registers". The term "accordion shift register", as will be more apparent from the description that follows, is chosen in view of the characteristic motional behavior of the data as it is being propagated down the latch channels.

In FIG. 2, the above A.S.R. system of direct connection is represented by the shaded trunk lines ( ⇒ ). Each line within such a trunk is a fan-out from the output of a preceding latch and is connected to the Scan Data Input of the succeeding latch, (see L1 in the SRL of FIG. 1A). Thus, one can trace out the entire accordion shift registers from PI$\phi$ to PO4.

For simplicity in the explanation of the shifting operation, the shifting clocks are shown as individually supplied and are labelled CA, CB, CC, CD and CE in the illustrated example of FIG. 2. One version of the clock sequences, used respectively for shift-in and shift-out operations, is shown in the charts of FIG. 3. Each chart contains two major parts. The left hand part details the two-phased clock activities at individual stages of the A.S.R. throughout the entire time sequence t1 to t9. The right hand part lists the data content in the latch banks following each clock time. The net effect in each operation is emphasized by the boxed items of each chart. That is, in FIG. 3A, the data shown in the DATA-IN column is finally moved and packed into the latch banks LL$\phi$–LL4 as shown at the bottom row of the right half chart. Similarly, in FIG. 3B, the data residing in the latch banks at t0, shown at the right half chart, is serially outputted from t0 to t8 as indicated in the DATA-OUT column. The proper output reading times are also indicated by the pointers to this column. (Reading control is understood to be built in the external testing equipment which supplies the A-/B-clocks and the gating signals to the LSI unit under test). It is also to be emphasized that the number of clock recycles required for either shift operation (in or out) is exactly the same as it would be required if L1–L2 type SRL's of the type disclosed in U.S. Pat. No. 3,783,254 were employed.

Referring again to FIGS. 3A and 3B, and examination of the detailed operations will reveal the following:

1. During the middle time portion of either the shift-in or the shift-out (t4, t5 and t6), the accordion Shift Register behaves just as a conventional Shift Register, with every pair of successive latches working as if they form conventional shift register stages (i.e., latches in LL$\phi$ serving as the L1's of a conventional SRL and those in LL1, as the L2's thereof, etc.). The illustrated five latch banks (LL$\phi$ through LL4) hold three sets of data at any one time during this period with each data occupying the successive latches for most of this time period.

2. During the closing time phase (t7, t8 and t9) of the shift-in (FIG. 3A), the data string within the chain of latch banks is caused to undergo a spacial compaction. The equivalent L2's yield their identity to that of the equivalent L1's in retrogression.

3. Conversely, during the opening time phase (t1, t2 and t3) of the shift-out (FIG. 3B), the data string within the chain is caused to undergo a spacial expansion. Successive equivalent L2's of apparent SRL's are created by this expansion process until the whole chain has grown to be a conventional Shift Register.

The name "accordion shift register", (abbreviated "A.S.R."), thus, gives a somewhat pictorial suggestion of the functioning manner (1), (2) and (3), as recited above, of a series of latches serving as an information handling instrument.

The pictorial name is considered rather superficial because as having been alluded to in a paragraph in "Summary of the Invention", the choice "accordion" is probably not as accurate a descriptive as "worming". For, one can see how vividly the successive input and output data does indeed worm through the device when he strings along a few of the above (1) (2) (3) sequences together. With "accordion", it just lacks that important ingredient of a forward movement. But, who wants "worming" for a descriptor.

With the benefit of the above observations and description on the central concept of the invention, I shall now explain and clarify a point of incidental significance concerning the clocking scheme.

In the clocking scheme of FIG. 3, the opening phase of the shift-in and the closing phase of the shift-out are shown symmetric with respect to their opposite phases. This is not a necessary requirement. Shifting clocks during these brief periods may be arbitrarily applied or withheld since the activities in these time-space regions do not have a meaningful effect on the end results of the relevant operations. To illustrate this point, a clocking scheme is depicted in FIGS. 4A and 4B, where the √ clocks are also assumed active. It can be seen that whatever goes on in the boxed triangular time-space (in the right hand half charts), it does not show in the end result. In any case, the symmetric clocking plan is preferred because it entails a simpler implementation requirement as will be seen presently.

The use of individual shift clocks CA, CB, ... CE as shown in FIG. 2 is perhaps acceptable when the shift register length is relatively small. For Accordion Shift Register lengths greater than five, the preferred gated clock implementation scheme of FIGS. 5A and 5B may be used.

Figure 5A:
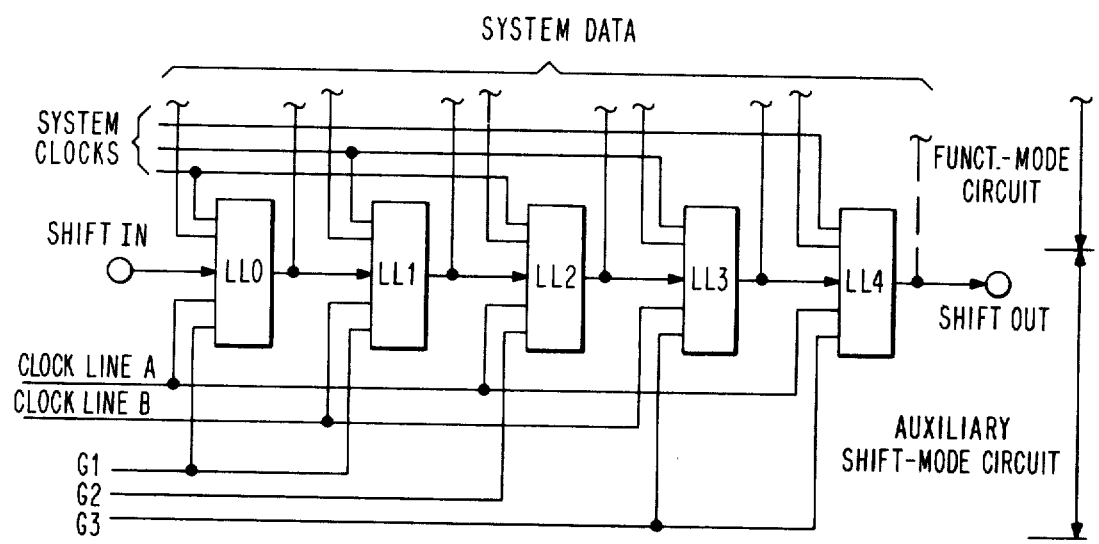
FIG. 5A depicts an A.S.R. singled out from its user environment but with the preferred shift-in clock gating arrangement.
Figure 5B:
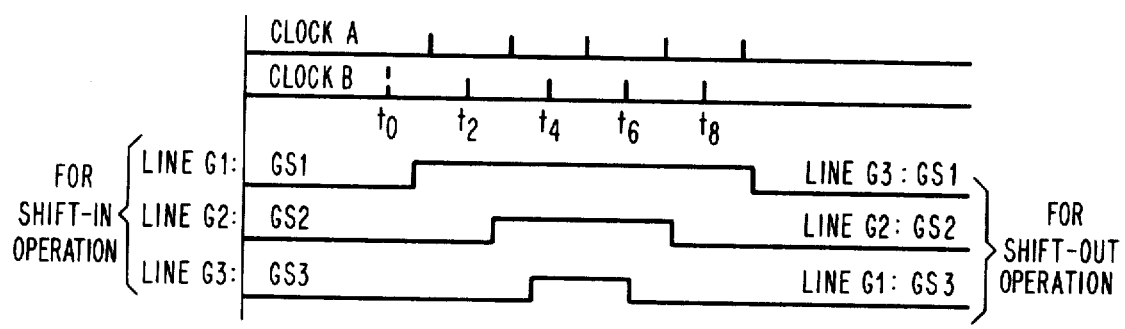
FIG. 5B depicts the A-/B-shifting clock signals and its gating control signals for shift-in and shift-out operations of the A.S.R. of FIG. 5A.

In this arrangement of FIGS. 5A and 5B, the scannable register latches used in the latch banks LL$\phi$-LL4, are of a type wherein the shifting clock is subjected to the control of a gating signal.

Figure 5C:
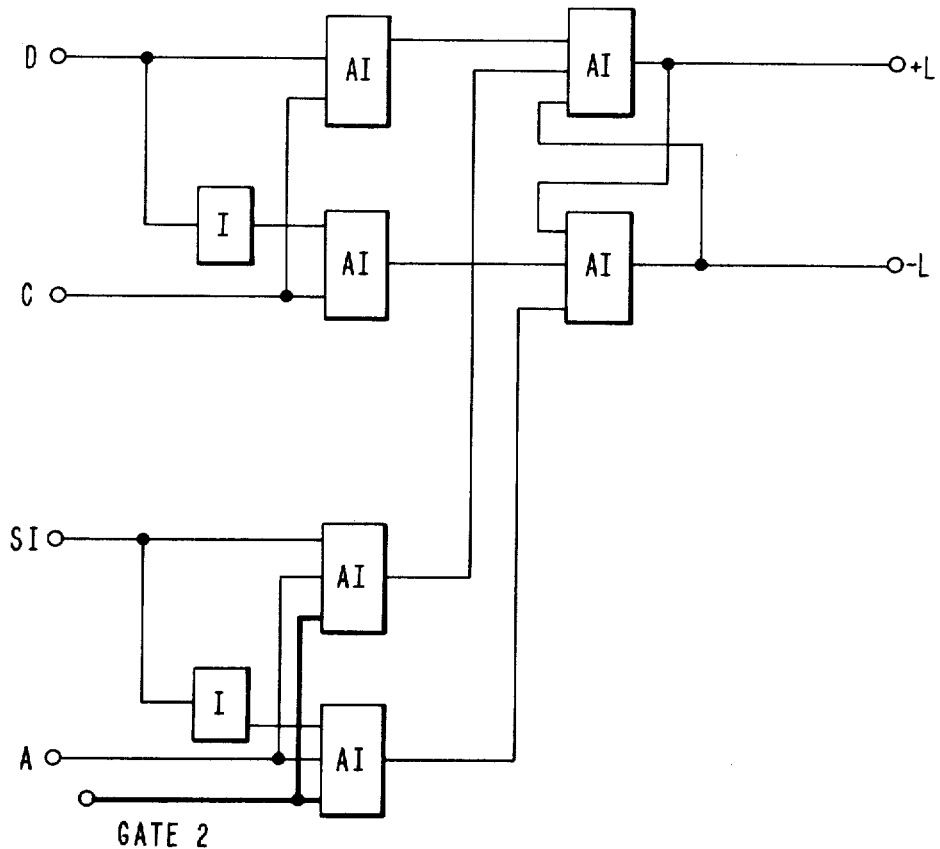
FIG. 5C depicts a block diagram of a Scannable register latch usable in an A.S.R.

Such a gated scannable register latch can be implemented without difficulty by one skilled in the art. One form of it is shown in FIG. 5C. It is to be recognized that the only difference between this design and that of L1 in FIG. 1F is the change of two two-way AI logic circuits to two three-way AI logic circuits where a gating signal will exercise control of the shifting clock (shown as coming on terminal A).

As shown in FIG. 5A, a conventional two-phase shift clock drive system (A-clock/B-clock) is connected to alternate stages of the Accordion Shift Register. For control of the shifting clocks, gate input terminals of certain one or two consecutive latches are wired to appropriate external gate sources as shown.

During a cycle of shift operation, the clocks A and B are turned on, each for a fixed number of clock cycles depending on the Accordion Shift Register length. The gating signal, viewed as an ordered set, is a function of the operation type.

I.E., Signal $OP_{-x}$ (line G1, line G2, line G3) is a function of "$OP_{-x}$", where "$OP_{-x}$" stands for "Shift-In" or "Shift-Out".

For the symmetrical clocking scheme of FIG. 3, (Note the triangular pattern of the clock activities, is symmetrical about the time $t5$) and with the symmetrical wiring of the gating controls of FIG. 5A (Note the wiring pattern of the three control lines G1, G2, G3 to the five latch banks LL$\phi$-LL4 is spacially symmetrical about the middle bank LL2), the gating signal set for Shift-In is an exact transposed function of that for Shift-Out. That is, while Signal $_{Shift-In}$(line G1, line G2, line G3) = (GS1, GS2, GS3), Signal $_{Shift-Out}$ (line G1, line G2, line G3) = (GS3, GS2, GS1)

as shown in FIG. 5B.

The above transposition relationship helps to simplify the gating signal generation, since one set of signals can be switched to conveniently serve both Shift-In and Shift-Out operations.

The non-symmetrical clocking schedule of FIG. 4 would not offer the same convenience.

Figure 5D:
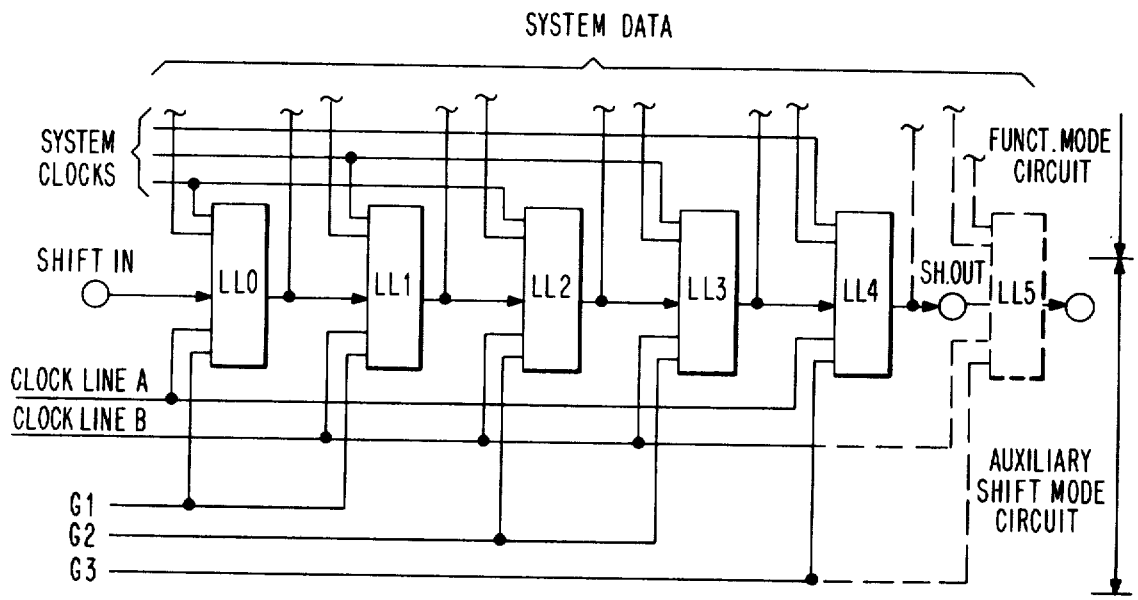
FIG. 5D depicts a similar A.S.R. as in FIG. 5A except that a modified gating control organization is used to facilitate extension to an A.S.R. of even number of stages.
Figure 5E:
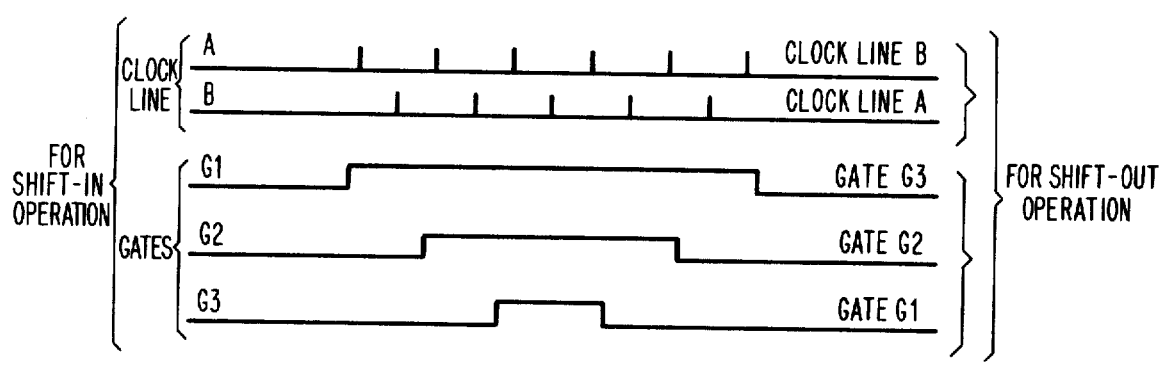
FIG. 5E depicts the A-/B-shifting clock signals and the gating control signals suitable for the A.S.R. of FIG. 5D.

FIGS. 5D and 5E give another design for an A.S.R. It is only a slightly rearranged version of that in FIGS. 5A and 5B, (both in the gate line wiring and in the shifting clock and gating control signals). The advantage with this arrangement is that it is suitable both for an odd number and for an even number of stages in the A.S.R., as is illustrated in FIG. 5D where the broken line stage LL5 may or may not be included.

Whether this arrangement is fully used for an even length A.S.R. channel or partially used for an odd length A.S.R. channel, the user must correspondingly schedule his proper input data feeding and output data taking times as in any system. Notice, in particular, when the shortened (i.e. odd length) A.S.R. is used, there should be a dummy data bit placed at the head of every input data bit train in order for all real data bits to take up their proper positions in the chain of latch banks at the conclusion of a shift-in operation.

Organizational Details

In introducing the use of the auxiliary accordion shift registers for the structured design of an LSI unit, I have tacitly taken, in the diagram of FIG. 2, a convenient case. There the number of register latches in all the logic stages is rather ideally distributed. In particular, there are taken as many primary input latches as primary output latches, all favorably located for the type of proposed construction.

In a more generally applicable design, the above ideal conditions rarely exists, and, of course, I shall not depend thereon for the implementation of my invention.

In my opinion, an adequate A.S.R. planning proposal for a practical LSI design must include provision for the following pertinent conditions: The latched data widths are very likely to vary from logic section to logic section. The primary I/O latches are seldom matching in numbers. The primary I/O latches are apt to be distributed randomly among the various logic sections. In certain cases, there may not be any primary I/O latches at all in the original logic design.

To illustrate how to handle these expected occurrences, I explain my proposed approach in three separate items below. A fourth and fifth item follow as extensions thereof.

1. The Organization Strategy for the A.S.R.'s and A Design Procedure

Figure 6:
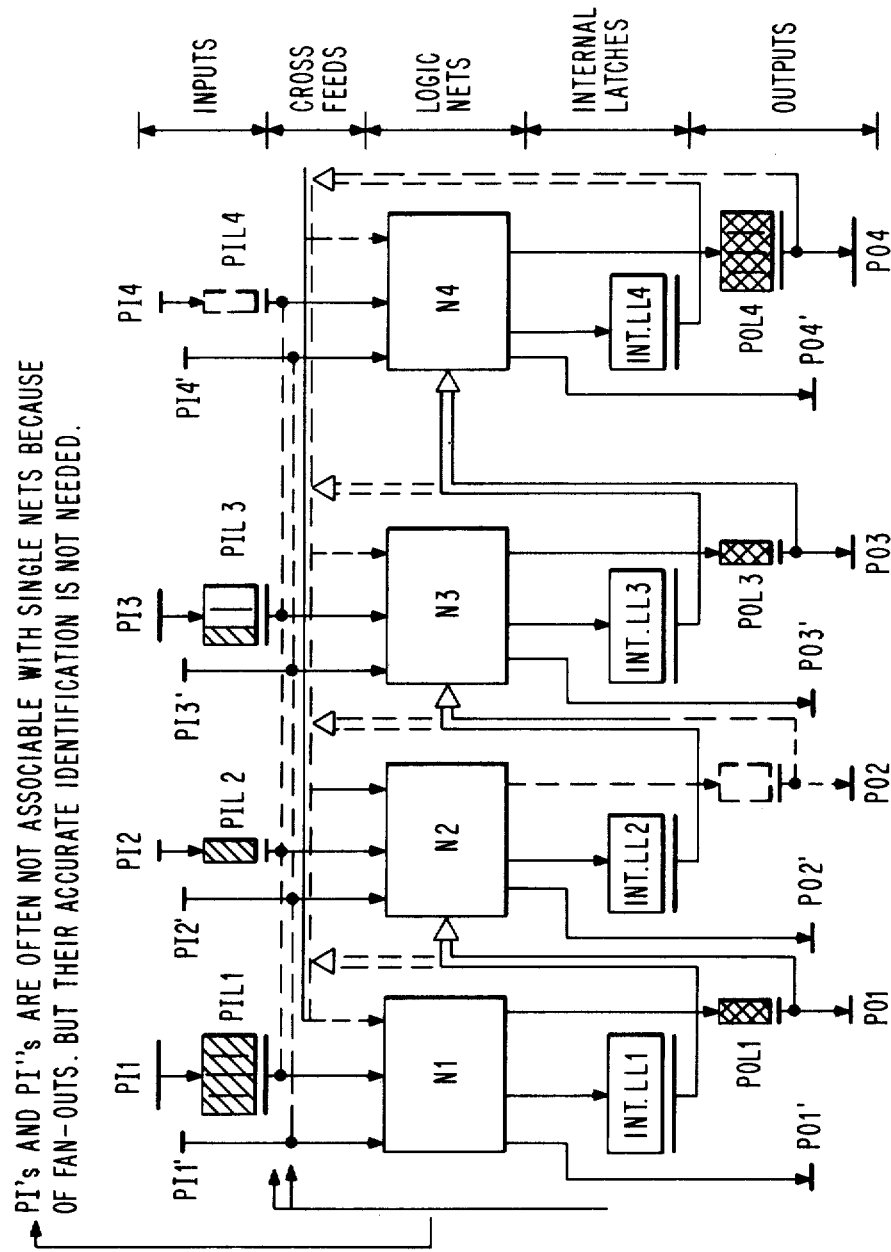
FIG. 6 depicts the functional data paths in a generalized realistic LSI design showing expectable irregularities in the distribution of PIL's, POL's and internal system latches.

An LSI unit with a generalized logic latch distribution is depicted in FIG. 6. FIG. 6 illustrates all but the fourth of the above mentioned conditions. The diagram of FIG. 6 is layed out in a manner similar to that of FIG. 2, but does not include the auxiliary A.S.R. data paths.

Two different organizational plans for the A.S.R. may be formulated for illustration purpose only. One is nominally transverse and the other is nominally longitudinal (in reference to the direction of the functional data flow). These nominally identifiable plans are by no means recommended ones. On the contrary, at this point, it is well to recognize that there is really no need of holding fast onto the functional data structure so far as the end purpose of the A.S.R. is concerned. One could as well regard all latched information as loose, or unstructured, bits. In this way, one will be at ease with the organizational feature of the A.S.R. and will find complete freedom in laying out a plan for the A.S.R. under given conditions, (e.g., wiring convenience may be taken as one of high priority).

As a practical procedure, the design for the A.S.R. in organizational form begins with an accounting of available primary I/O latches, no matter where they are. Thereupon, the number of parallel A.S.R. channels may be decided. Unused PIL's and/or POL's, if any, will then be treated as if they were members of some internal latch groups.

In the case of FIG. 6, there are eight PIL's and six POL's. The eight PIL's are the four latches in PIL1, one latch in PIL2 and three latches in PIL3. The six POL's are the one latch each in POL1 and POL3 and the four latches in POL4. Six A.S.R. channels could then be decided in order to put as many available facilities to good service as possible. The two unselected latches in the group PIL3 would now be regrouped with those in LL2 for further treatment.

With the I/O stages of the A.S.R.'s chosen, their lengths are then readily determined, preferably with no two A.S.R.'s differing in lengths by more than one position. In this illustration, a dummy latch (shown only in the chart of FIG. 7) is placed in the #6 channel to make all channels of uniform length (5).

This is followed by the assignment of individual internal latches into each A.S.R. channel and their ordering within the channel. These are done in essential accordance to either the transverse plan of Design (a) of FIG. 7 or the longitudinal plan of Design (b) of the same figure.

Figures 8, 9:
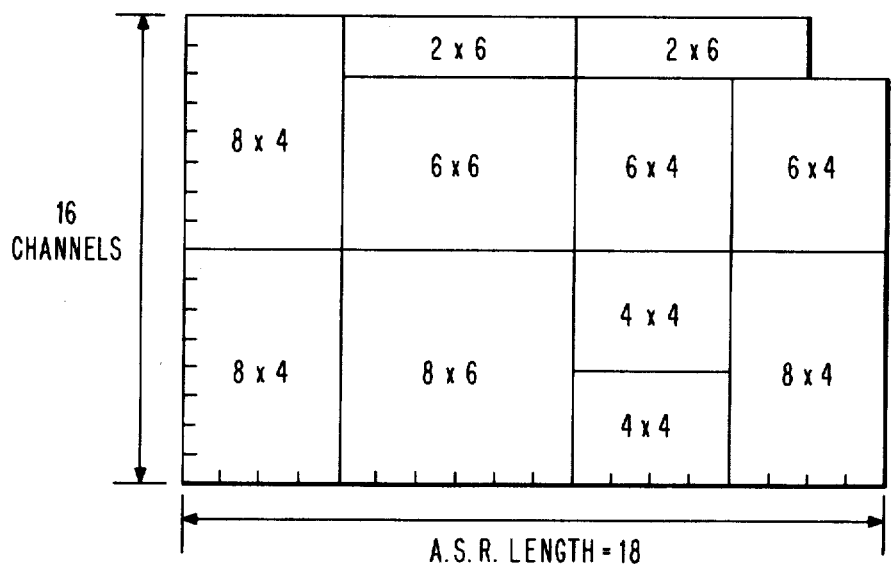
FIG. 8 illustrates a cross-reference table for the Design (a) of FIG. 7.
FIG. 9 depicts concatenation of several A.S.R.'s into a higher level A.S.R.

Two sets of cross reference tables may then be prepared for application convenience. One set uses the functional logic data structure as reference, as shown in FIG. 7. The other uses the A.S.R. structure as reference. An example for the transverse case of FIG. 7 is shown in FIG. 8.

It is to be noted, the above organizational considerations, (including the use of multiple channels), and the need of cross referencing are implied in the application of LSSD rules using the prior art SRL hardware. Only, the use of parallel channels is emphasized, and the details for arriving at specific configurations are elaborated here.

2. Use of Pseudo-PIL's and Pseudo-POL's and

3. Use of I/O Pad Sharing

Now, suppose one has more POL's than PIL's in a given design, and he wants to fully make use of the available POL's in arranging for his A.S.R.'s. Such a deficiency in the available PIL's can be easily corrected by creating "pseudo-PIL's".

A pseudo-PIL is simply an internal latch in an LSI unit with its Scan Data Input terminal, (SI of FIG. 5C), brought to an external I-pad so that the latch takes up the position of a PIL at shifting times. In case an LSI design is already I/O pad limited without a pseudo-PIL, the latter can always share the use of an I-pad with a suitable functional data channel. This convenience is always present because the shift-mode operation is isolated in time from that of the function-mode. An illustration is given in FIG. 10A, where LA is a natural PIL. Lc is used as a pseudo-PIL which does enjoy the exclusive use of a spare pad for its scan data Input. LD is also used as a pseudo-PIL but its scan data input shares the use of an input pad P1 with a system data input. If necessary, the scan input I of LA may also share the use of some system input pad, as illustrated by the dotted line.

With the above scheme, the designer is never hampered by not having enough PIL's to use in planning for an auxiliary A.S.R. system.

An opposite condition from that assumed in the above may exist in a practical design. That is, there may be a natural deficiency in the number of available POL's, or as a result of an unlimited supply of pseudo-PIL's at his command, a designer may desire more POL's than are available in a given LSI unit.

Figure 10:
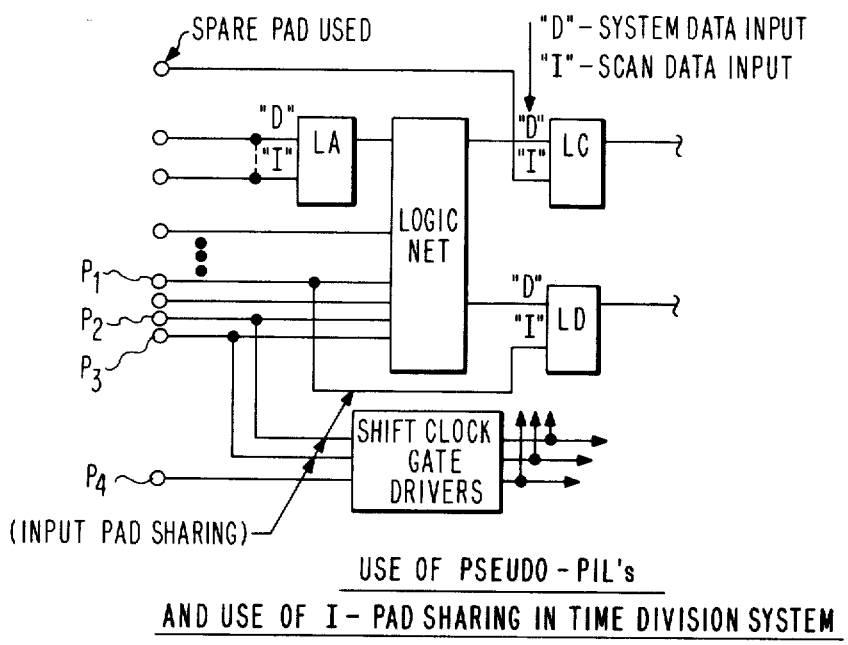
FIGS. 10A and 10B depict respectively relevant input and output circuits of an A.S.R. system, showing creation and use of pseudo-PIL's and pseudo-POL's and the practice of I/O terminal sharing schemes.
Figure 10:
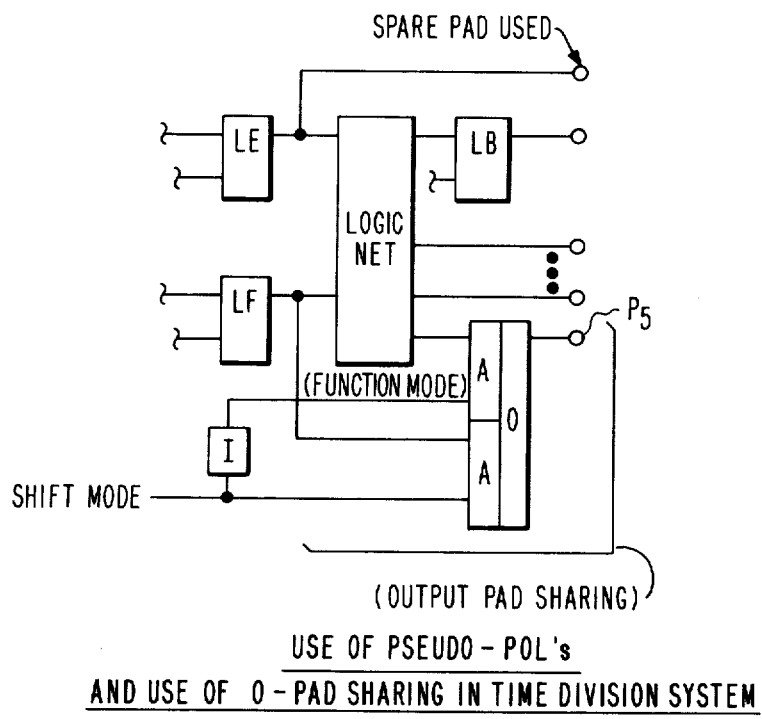

Certainly, the similar concept of creating pseudo-POL's for use will also work without difficulty if spare terminal pads are available. If not, the sharing in the use of suitable functional data O-pads can also be implemented, but not as simply as in the pseudo-PIL case. Nevertheless, the expenditure is still nominal, as can be seen from the illustrations in FIG. 10B. In FIG. 10B, LB shows a natural POL. LE is used as a pseudo-POL which enjoys the use of a spare pad for its scan data output. LF is also used as a pseudo-POL but its scan data output shares the use of an output pad $p5$ with a system data output through an A-O switch as shown. It is to be noted that, when such logic switching becomes necessary, a mode control facility should be provided, also as shown.

Thus, again, the designer of an auxiliary A.S.R. system is not constrained by the availability of natural POL's.

He is also practically free from I/O pads (pins) limitations.

4. Time Shared Use of I/O Pads Extended to Handle Gating Signal Inputs

As is apparent to persons skilled in the art, the above solutions to the availability of PIL's and POL's as well as of I/O pads (pins), respectively, are merely applications of a well known principle, namely, the shared use of a physical (or spacial) facility in a "time division system". As will be apparent to persons skilled in the art, this principle may be applied to further advantages in the LSI structured design.

One immediate case for attention is the inputting of the gating signals for control of the shift clocks. Normally, the use of these signals in the disclosed A.S.R. system would represent a requirement of additional input pads. Now, recognized for their timed isolation from the functional data channels, they need not be made to occupy exclusive I-pads, but may be let in on shared pads when it is necessary to do so. An illustration is included in FIG. 10A, where the box "shift clock gate drivers" is shown to receive one gate signal input from an exclusive I-pad P4 and two gate inputs from shared I-pads P2 and P3.

So, the use of the shift clock gates in the proposed auxiliary A.S.R. system need not add burden to the overall structured design for an LSI unit beyond what is already there, especially where the I/O limitations are concerned.

5. Auxiliary A.S.R.'s in A Higher Level LSI Unit

When several low level LSI units (say chips), each with its own system of auxiliary A.S.R., are assembled to form a higher level LSI unit (say a module), there is a problem of piecing the component A.S.R.'s together to form one or more larger auxiliary A.S.R.'s. However, this problem is no more complicated than when the conventional parallel auxiliary SR's are used. It generally entails the following:

1. Possible sub-grouping of the lower level LSI units when there is a large number of them.
2. Identifying the lower level units which are to supply the PIL's and the POL's for the higher level LSI unit. The use of the pseudo-PIL's and pseudo-POL's is equally applicable at this level.
3. The piecing together of component A.S.R.'s to give composite A.S.R.'s of nearly uniform lengths.

FIG. 9 illustrates a high level A.S.R. composition. Each compartment represents one A.S.R. system of ($m$ channels) × ($n$ stages per channel) belonging to one LSI of some low package level, say a chip. There are eleven chips in the illustrated higher level assembly, say a module. Matching channels in the neighboring chips are to be wired into a continuing channel. In total, the module is shown to contain 16 channels mostly of 18 stages per channel. The two indicated channels of 16 stages could have been padded to 18 if the designer so chose to do.

Note that in order to facilitate stringing along component A.S.R.'s of various widths and lengths into a higher level A.S.R., all component A.S.R.'s are preferably arranged to have even lengths, (by adding a few dummy latches if necessary). This becomes a desired preparation because of the shifting clock gating wiring scheme used.

Note also that the channel lengths of the composite A.S.R. may be left non-uniform if not further building up of a still higher level LSI unit is planned.

Combined Shift-Out Shift-In Operation of An A.S.R.

With the urgent items of the A.S.R. organizational details out of the way, I now return to an earlier subject and introduce a refinement to the A-/B-shift clock scheduling which is particularly suitable for the LSSD environment.

In a predominantly large number of test/diagnostics operations in an LSSD system, data shift-in follows data shift-out without an intervening system mode operation. Under this condition, one may partially overlap the input and the output shiftings of an A.S.R. to accelerate the overall test operation. And, as it turns out, the combined shift-out shift-in of an A.S.R. also requires a set of simpler gating signals for its operation, which is an equally welcomed advantage.

The procedure is best explained by referring to the illustrated case of FIGS. 3B and 3A.

Observe that during the shift-out operation, from the time $t5$ on, the latch banks LL$\phi$, LL1, etc. will be progressively freed of their function as an output apparatus. This enables commencing the shift-in operation at $t5$ of the FIG. 3B. I.E., make "$t1$ of FIG. 3A" identified with "$t5$ of FIG. 3B", and append the entire clock schedule of FIG. 3A to that of FIG. 3B. The effect of such dovetailing of the shift-in with the shift-out can be seen by parallelly appending the latch content chart of FIG. 3A to that of FIG. 3B, with the two diagonal arrays of "Do's of FIG. 3B". Thus, a composite chart for the combined operation, though not included here, can be clearly visualized.

Figure 11:
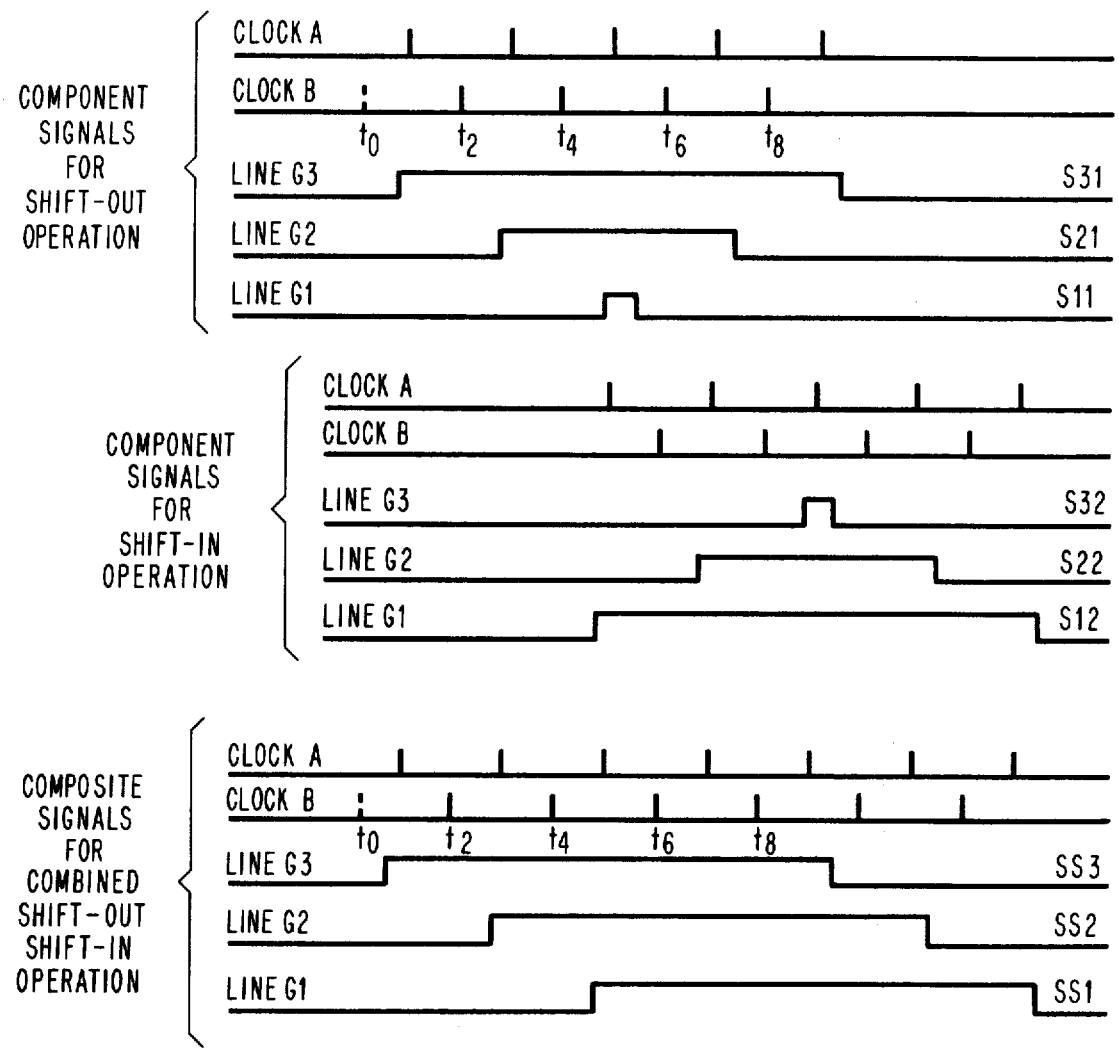
FIG. 11 exhibits three sets of shift clock and gating control signals for an A.S.R. system showing how the signals for the combined shift-out shift-in operation are composed of those for its component operations.

The upper two thirds of FIG. 11 depicts the component signals for the shift-out and shift-in operations with their relative timing properly aligned, in accordance with the aforementioned manner. Attention is directed to the gating signals applied to the individual gate lines G1, G2 and G3. It is not difficult to recognize that the overlapping of component gating signals on these lines results in a set of simpler gating signals than their component ones, as shown in the bottom set of diagrams of FIG. 11. Here, the gating signals SS2 and SS1 are identical to SS3 except delayed by one and two clock (A or B) periods respectively.

Thus, it is to be appreciated that by using the combined shift-out shift-in scheme for the A.S.R., one not only obtains a faster overall operation but also gains simplicity in the gating signal generation equipment.

With all the foregoing descriptions of the central and the supplementary concepts, it is now apparent the use of the auxiliary accordion shift registers (A.S.R.) in an LSI design reduces hardware that is attributable to the use of conventional SRL's in the manner disclosed in U.S. Pat. No. 3,783,254. It does not affect, in any way, the intended mode of operation for the LSI unit in the context of the structured design as embodied in the LSSD rules. (Reference is made to U.S Pat. No. 3,783,254). Nor does it degrade the performance quality. In fact, by its preferred multi-channel organization, it takes full advantage of this option, resulting in faster Shift-In Shift-Out than the single channel design (especially when the combined shift-out shift-in operation is adopted).

As the improvement is brought about entirely by a novel manipulation in the shift-mode domain, it is absolutely transparent to the function-mode world. Hence, all aspects of logic simulation and/or automatic test data generation will not be disturbed by the substitution of A.S.R.'s for conventional SR's in the auxiliary system.

Reference is made to U.S. Pat. Nos. 3,761,695 and 3,784,907, fully identified and discussed supra and of common assignee herewith.

It is now submitted to be readily apparent to persons skilled in the art, particularly in view of the foregoing detailed description and explanation of my invention, that numerous modifications may be made in the structural embodiments for practicing my invention without departing therefrom.

For example, one may devise circuits within the LSI unit under test to generate the gating signals SS1 and SS2 of FIG. 11 based on the inputting of a single gating signal SS3 and the A- and B-clocks of FIG. 11 to that unit. This is feasible since the signals S1 and S2 are simply related to SS3.

For another example, one may choose to use a three- or four-phase clock instead of a two-phase clock (i.e., A- B-clocks) in the shift mode operation.

For still another example, in the application of the supplementary teaching of I/O sharing one may wish to use the I/O pads involved in common bus lines among several low level LSI units (say chips). The I/O sharing will be helped by the use of chip-select arrangements to inhibit unselected circuits on the bus lines during shift mode operations. Such chip-select arrangements are similar to those regularly employed in memory array systems.

While the invention has been particularly shown and described with reference to preferred embodiments, it will be understood by those skilled in the art that the foregoing and other changes in form and detail may be made herein without departing from the spirit or scope of the invention.

What is claimed is:

1. A functional logic unit for use in a digital computer or the like comprising:
   a plurality of latches;
   first connection means for connecting said latches into an accordion shift register;
   means for generating a plurality of clock signal trains;
   means selectively connecting each of said clock signal trains to at least certain ones of said plurality of latches;
   a plurality of networks, each network receiving a binary input and providing a binary output bearing a fixed logical relationship to its binary input;

means selectively interconnecting at least certain ones of said latches with the input and output of selected ones of said networks, whereby said functional logic unit performs at least one predetermined logical function.

2. A functional logic unit as recited in claim 1, contained on a single semiconductor chip having a plurality of chip input terminals and a plurality of chip output terminals, second connection means connecting at least certain of said plurality of chip input terminals to selected ones of said networks, and third connection means connecting at least certain ones of said latches of said accordion shift register to selected ones of said chip output terminals.

3. A functional logic unit for use in a digital computer or the like, as recited in claim 1 wherein said functional logic unit comprises a plurality of semiconductor chips fabricated by large scale integration techniques and said first connection means connects said plurality of latches into at least first and second accordion shift registers.

4. A functional logic unit, as recited in claim 3, wherein each of said first and second accordion shift registers has an integer number of stages, where each said integer number is equal to or greater than two and said integer number for said first accordion shift register is not necessarily equal to said integer number for said second accordion shift register, and further where each said stage of each of said shift registers comprises a single direct current latch.

5. A functional logic unit, as recited in claim 4, wherein each direct current latch is a polarity hold latch.

6. A functional logic unit, as recited in claim 4, wherein each direct current latch is a set-reset latch.

7. A level sensitive embedded array logic system fabricated by large scale integration techniques on a semiconductor chip: said system comprising:
means for accepting a set of system input signals;
means for providing a plurality of clock signal trains having a predetermined duration between the occurrence of signals in successive trains;
a first group of latch circuit means for receiving at least certain ones of said set of system input signals and selected ones of said clock signal trains;
a second group of latch circuit means including system output means, said second group of latch circuit means receiving at least certain other selected ones of said clock signal trains;
combinational logic circuit means including at least one read/write array, said combinational logic circuit means connecting said first group of latches to said second group of latches; and
additional circuit means connecting said first group of latch circuit means into a first accordion shift register, and said second group of latch circuits into a second accordion shift register.

8. A level sensitive embedded array logic system as recited in claim 7, wherein each latch circuit means comprises a bistable direct current latch having at least an excitation input, a clock input and an output.

9. A level sensitive embedded array logic system, as recited in claim 7, wherein each said latch circuit means comprises a polarity hold latch.

10. A level sensitive embedded array logic system, as recited in claim 7, wherein each said latch circuit means comprises a clocked set-reset latch.

11. A functional logic unit, said functional logic unit comprising:

first means for providing a set of data input signals;
first latch circuit means for receiving said set of data input signals and under control of at least one clock signal providing a set of output signals;
a combinational logic network circuit having a set of input terminals for receiving said set of output signals from said first latch circuit means and providing a set of output signals;
combinational logic network circuit means including a read/write storage array having a storage capacity of M × N binary bits for receiving said set of output signals from said combinational logic network circuit and providing a functional logic unit output set of signals;
second latch circuit means for receiving said functional logic unit output set of signals and under control of at least a second clock signal providing a further set of signals;
additional circuit means for feeding back at least a selected one of said further set of signals to said first latch circuit means; and
further means for connecting said first latch circuit means and said second latch circuit means into at least one multi-bit position accordion shift register.

12. A functional logic unit as recited in claim 11 wherein each bit position of the accordion shift register is comprised of a single direct current bistable latch.

13. A functional logic unit, said unit comprising:
a first plurality of latch circuit means, each said latch circuit means of said first plurality of latch circuit means receiving at least one data input and providing at least one data output, under control of at least one clock signal train input;
a second plurality of latch circuit means, each said latch circuit means of said second plurality of latch circuit means receiving at least one data input and providing at least one data output, under control of at least one clock signal train input;
a first combinational logic network having a plurality of inputs respectively connected to receive said data outputs of said first plurality of latch circuit means and provide first and second sets of outputs;
a read/write memory having the capacity to store an integer number of binary bits, said read/write memory receiving said first set of outputs from said first combinational logic network and providing a multi-bit binary output;
a second combinational logic network having a plurality of inputs connected to receive said multi-bit binary output of said read/write memory and said second set of outputs of said first combinational logic network and providing a functional logic unit output to said data inputs of said second plurality of latch circuit means;
connection means connecting at least certain ones of said data outputs of said second plurality of latch circuit means to predetermined ones of said data inputs of said first plurality of latch circuit means; and
further means connecting said first plurality of latch circuit means and said second plurality of latch circuit means into at least one multi-bit position accordion shift register.

14. A functional logic unit, as recited in claim 13, wherein said first plurality of latch circuit means are interconnected to provide a first multi-bit position accordion shift register, and said second plurality of latch circuit means are interconnected to provide a second multi-bit position accordion shift register, where each bit position of said first and second accordion shift registers includes a single direct current bistable latch.

15. A functional logic unit, said functional logic unit comprising:
   first means for providing a set of data input signals;
   first latch circuit means for receiving said set of data input signals and under control of at least one clock signal provides a set of output signals;
   a combinational logic network circuit having a set of input terminals for receiving said set of output signals from said first latch circuit means and providing a set of output signals;
   combinational logic network circuit means including a programmable logic array for receiving said set of output signals from said combinational logic network circuit and providing a functional logic unit output set of signals;
   second latch circuit means for receiving said functional logic unit output set of signals and under control of at least a second clock signal provides a further set of signals;
   additional circuit means feeding back at least a selected one of said further set of signals to said first latch circuit means; and
   further means connecting said first and second latch circuit means into at least one multi-bit position accordion shift register.

16. A functional logic unit, said unit comprising:
   a first plurality of latch circuit means, each said latch circuit means of said first plurality of latch circuit means receiving at least one data input and providing at least one data output, under control of at least one clock signal input;
   a second plurality of latch circuit means, each said latch circuit means of said second plurality of latch circuit means receiving at least one data input and providing at least one data output, under control of at least one clock signal input;
   a first combinational logic network having a plurality of inputs respectively connected to receive said data outputs of said first plurality of latch circuit means and providing first and second sets of outputs;
   a programmable logic array receiving said first set of outputs from said first combinational logic network and providing a multi-bit binary output;
   a second combinational logic network having a plurality of inputs connected to receive said multi-bit binary output of said programmable logic array and said second set of outputs of said first combinational logic network and providing a functional logic unit output to said data inputs of said second plurality of latch circuit means;
   connection means connecting at least certain ones of said data outputs of said second plurality of latch circuit means to predetermined ones of said data inputs of said first plurality of latch circuit means; and
   further means connecting said first and second latch circuit means into at least one multi-bit position accordion shift register.

17. An accordion shift register for storing digital data: said accordion shift register comprising:
   a plurality of direct current bistable latches, each of said latches having an input terminal and an output terminal;
   a shift register input terminal;
   a shift register output terminal;
   passive connection means connecting in cascade between said register input terminal and said register output terminal, said plurality of direct current bistable latches, with the output terminal of each said latch, but one, directly coupled to the input terminal of the next succeeding latch;
   control means connected to said plurality of latches for controlling the shifting of data into, within and out of said accordion shift register.

* * * * *